(12) United States Patent
    Xuan

(10) Patent No.: US 9,479,128 B2
(45) Date of Patent: Oct. 25, 2016

(54) MULTI-MODE POWER AMPLIFIER AND MOBILE COMMUNICATION TERMINAL HAVING THE SAME

(71) Applicant: China Uni-Chip Technologies Inc., Wuxi, Jiangsu (CN)

(72) Inventor: Kai Xuan, Wuxi (CN)

(73) Assignee: CHINA UNI-CHIP TECHNOLOGIES INC., Wuxi, Jiangsu (CN)

( * ) Notice: Subject to any disclaimer, the term of this patent is extended or adjusted under 35 U.S.C. 154(b) by 0 days.

(21) Appl. No.: 14/459,946

(22) Filed: Aug. 14, 2014

(65) Prior Publication Data
    US 2015/0137891 A1    May 21, 2015

(30) Foreign Application Priority Data
    Nov. 21, 2013    (CN) .......................... 2013 1 0595507

(51) Int. Cl.
    *H03F 1/14*     (2006.01)
    *H03F 3/19*     (2006.01)
    *H03F 3/21*     (2006.01)
    *H03F 3/24*     (2006.01)
    *H04B 1/401*    (2015.01)
    *H04B 1/04*     (2006.01)
    (Continued)

(52) U.S. Cl.
    CPC .............. *H03F 3/19* (2013.01); *H03F 1/0261* (2013.01); *H03F 1/0277* (2013.01); *H03F 1/56* (2013.01); *H03F 3/195* (2013.01); *H03F 3/211* (2013.01); *H03F 3/24* (2013.01); *H03F 3/245* (2013.01); *H03F 3/72* (2013.01); *H04B 1/0458* (2013.01); *H04B 1/401* (2013.01); *H03F 2200/222* (2013.01); *H03F 2200/387* (2013.01); *H03F 2200/429* (2013.01); *H03F 2200/451* (2013.01); *H03F 2203/21142* (2013.01); *H03F 2203/7206* (2013.01); *H03F 2203/7215* (2013.01); *H03F 2203/7221* (2013.01); *H03F 2203/7236* (2013.01); *H04B 2001/0408* (2013.01)

(58) Field of Classification Search
    CPC ...... H03F 1/26; H03F 1/0227; H03F 1/0211; H03F 3/24; H03F 2200/351; H03F 2200/451; H03F 2200/504; H03G 3/3042; H04B 1/44; H04B 15/005; H04B 1/0458; H02M 1/10; H02M 2001/0067; G05F 1/468
    USPC .............. 330/51, 124 R, 129, 278, 295, 302; 323/268, 273, 282; 363/59, 60, 61; 327/551–559; 455/78
    See application file for complete search history.

(56) References Cited

U.S. PATENT DOCUMENTS

8,269,561 B1 * 9/2012 Park .......................... 330/124 R
8,749,305 B2 * 6/2014 Retz ...................... H03F 1/0277
                                                              330/124 R
(Continued)

*Primary Examiner* — Steven J Mottola
*Assistant Examiner* — Hafizur Rahman
(74) *Attorney, Agent, or Firm* — Han IP Corporation; Andy M. Han

(57) ABSTRACT

A multi-mode power amplifier comprises a regulation control circuit, an AMP 1, a demultiplexer, an AMP 2, a low power output matching circuit, a medium power output matching circuit, and a high power output matching circuit. In low power mode, the regulation control circuit controls AMP 1 to work in a first power mode, and controls the demultiplexer to couple an output terminal of AMP 1 to the low power output matching circuit. In the medium power mode, the regulation control circuit controls AMP 1 to work in a second power mode, and controls the demultiplexer to couple an output terminal of AMP 1 to the medium power output matching circuit. In high power mode, the regulation control circuit controls AMP 1 to work in the second power mode, and controls the demultiplexer to couple an output terminal of AMP 1 to AMP 2.

14 Claims, 2 Drawing Sheets

(51) Int. Cl.
*H03F 1/02* (2006.01)
*H03F 1/56* (2006.01)
*H03F 3/195* (2006.01)
*H03F 3/72* (2006.01)

(56) References Cited

U.S. PATENT DOCUMENTS

2010/0327969 A1* 12/2010 Jung ................ H03F 1/0277
　　　　　　　　　　　　　　　　　　　330/124 R
2011/0032035 A1* 2/2011 Pletcher ............... H03F 1/0277
　　　　　　　　　　　　　　　　　　　330/277
2011/0260797 A1* 10/2011 Lee ........................ H03F 3/211
　　　　　　　　　　　　　　　　　　　330/295
2012/0229217 A1* 9/2012 Kawano ................ H03F 1/0261
　　　　　　　　　　　　　　　　　　　330/295
2013/0314163 A1* 11/2013 Costa ...................... H03F 3/193
　　　　　　　　　　　　　　　　　　　330/296
2014/0016517 A1* 1/2014 Khlat .................. H04B 1/0483
　　　　　　　　　　　　　　　　　　　370/278

* cited by examiner

MULTI-MODE POWER AMPLIFIER AND MOBILE COMMUNICATION TERMINAL HAVING THE SAME

CROSS REFERENCE TO RELATED PATENT APPLICATION

The present disclosure claims the priority benefit of China Patent Application No. 201310595507.1, filed on 21 Nov. 2013, which is herein incorporated by reference in its entirety.

TECHNICAL FIELD

The present disclosure relates to the field of IC design, and particularly relates to a multi-mode power amplifier and a mobile communication terminal having the same.

BACKGROUND

In the modern mobile communication system, especially a mobile phone, to prolong the service life of a lithium battery, extend the talk time, and reduce the current consumption of a power amplifier, improving efficiency of the power amplifier is an effective way. Accordingly, there have been invented a plurality of methods for improving efficiency of the power amplifier, like class-E and class-F power amplifiers. Such amplifiers achieve very high efficiency when output power reaches a saturation value.

However, in the communication system, sometimes the system does not need high transmit power. To enable the system to have high efficiency in cases of power back-off, a multi-mode power amplifier is developed. The transmit power is set according to the power required by the communication system in the multi-mode power amplifier, such that the communication system still maintains high efficiency in cases of power back-off. Generally the multi-mode power amplifier supports three working modes, a low power mode (LPM), a medium power mode (MPM), and a high power mode (HPM). The multi-mode power amplifier is widely applied in 3G/4G mobile phones.

FIG. 1 shows a typical multi-mode power amplifier in the prior art. As illustrated in FIG. 1, the multi-mode power amplifier has three signal paths, i.e., a low power amplifier path, a medium power amplifier path, and a high power amplifier path. Each power amplifier path comprises a first switching circuit, an input matching circuit, a power amplifier module ($Q_L$, $Q_M$, or $Q_H$), an output matching circuit, and a second switching circuit. In the low power mode, the switching circuits are controlled to conduct the low power amplifier path, and cut off other power amplifier paths, and an input radio frequency signal RFIN is transmitted over the low power amplifier path and then a power-amplified radio frequency signal RFOUT is obtained. In the medium power mode, the switching circuits are controlled to conduct the medium power amplifier path, and cut off other power amplifier paths, and the input radio frequency signal RFIN is transmitted over the medium power amplifier path and then the power-amplified radio frequency signal RFOUT is obtained. In the high power mode, the switching circuits are controlled to conduct the high power amplifier path, and cut off other power amplifier paths, and the input radio frequency signal RFIN is transmitted over the high power amplifier path and then the power-amplified radio frequency signal RFOUT is obtained.

Such multi-mode power amplifiers can effectively improve efficiency of the communication system, however it has one or more of following disadvantages: 1. a separate power amplifier path needs to be developed with respect to each mode, thus the design period is long and the development cost is high; 2. the multi-mode power amplifier needs three power amplifier units having different powers, thus a large area is occupied; 3. design and debugging of the output matching circuit are complicated, thus the research and development cost is high; 4. the stages of the power amplifier are not changed in different power modes, such that the power gain in the three power modes has no notable difference, and a high requirement is imposed on a dynamic range of the transceiver.

Therefore, an improved multi-mode power amplifier is desired to overcome the above problem.

SUMMARY

One technical problem to be solved in the present disclosure is to provide a multi-mode power amplifier, which occupies a small area and is low cost.

To solve the above technical problem, according to an aspect of the present disclosure, the present disclosure provides a multi-mode power amplifier having a low power mode, a medium power mode and a high power mode. The multi-mode power amplifier comprises: a power-tunable first power amplifier unit having a first power mode and a second power mode and having lower power in the first power mode than in the second power mode; a demultiplexer having an input terminal coupling to an output terminal of the first power amplifier, a first output terminal, a second output terminal and a third output terminal; a low power output matching circuit having an input terminal coupling to the first output terminal of the demultiplexer and an output terminal; a medium power output matching circuit having an input terminal coupling to the second output terminal of the demultiplexer and an output terminal; a second power amplifier unit having an input terminal coupling to the third output terminal of the demultiplexer and an output terminal; a high power output matching circuit having an input terminal coupling to the output terminal of the second power amplifier unit and an output terminal coupling to the output terminals of the low power output matching circuit and the medium power output matching circuit; a regulation control circuit configured to control the first power amplifier unit to work in the first power mode and control the demultiplexer to connect the output terminal of the first power amplifier unit to the input terminal of the low power output matching circuit when the multi-mode power amplifier is in the lower power mode, control the first power amplifier unit to work in the second power mode and control the demultiplexer to connect the output terminal of the first power amplifier unit to the input terminal of the medium power output matching circuit when the multi-mode power amplifier is in the medium power mode, control the first power amplifier unit to work in the second power mode and control the demultiplexer to connect the output terminal of the first power amplifier unit to the input terminal of the second power amplifier unit.

Since the demultiplexer and the power-tunable first power amplifier unit are introduced to the multi-mode power amplifier in the present disclosure, the low power mode, the medium power mode and the high power modes may be implemented by using two power amplifier units. Therefore, the multi-mode power may occupy smaller chip area and have the lower fabrication cost.

With respect to other objectives, characteristics, and advantages of the present disclosure, detailed description is given below with reference to the drawings and specific embodiments.

BRIEF DESCRIPTION OF THE DRAWINGS

These and other features, aspects, and advantages of the present disclosure will become better understood with regard to the following description, appended claims, and accompanying drawings where:

DETAILED DESCRIPTION OF VARIOUS EMBODIMENTS

The detailed description of the present disclosure is presented largely in terms of procedures, steps, logic blocks, processing, or other symbolic representations that directly or indirectly resemble the operations of devices or systems contemplated in the present disclosure. These descriptions and representations are typically used by those skilled in the art to most effectively convey the substance of their work to others skilled in the art.

Reference herein to "one embodiment" or "an embodiment" means that a particular feature, structure, or characteristic described in connection with the embodiment can be included in at least one embodiment of the present disclosure. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or the use of sequence numbers representing one or more embodiments of the present disclosure do not inherently indicate any particular order nor imply any limitations in the present disclosure.

Figure 1:
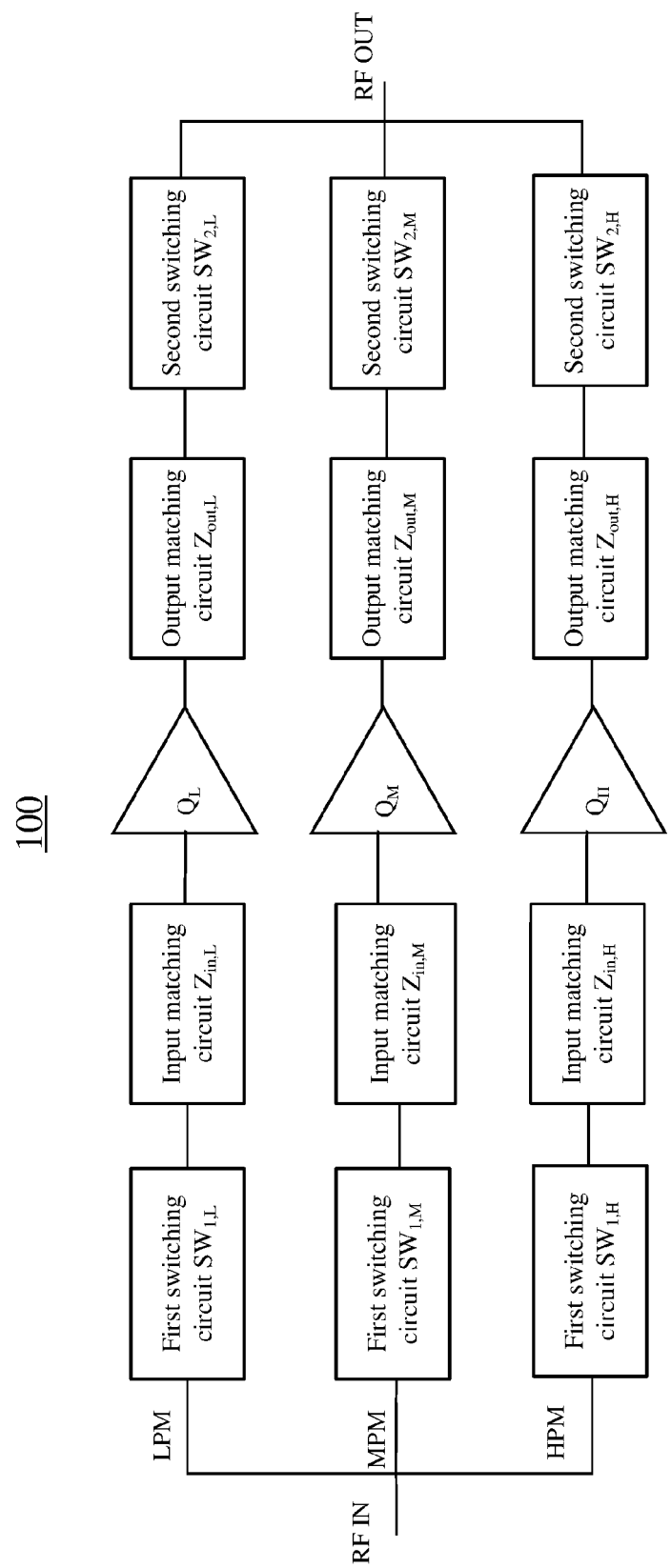
FIG. 1 is a block diagram showing a conventional multi-mode power amplifier.
Figure 2:
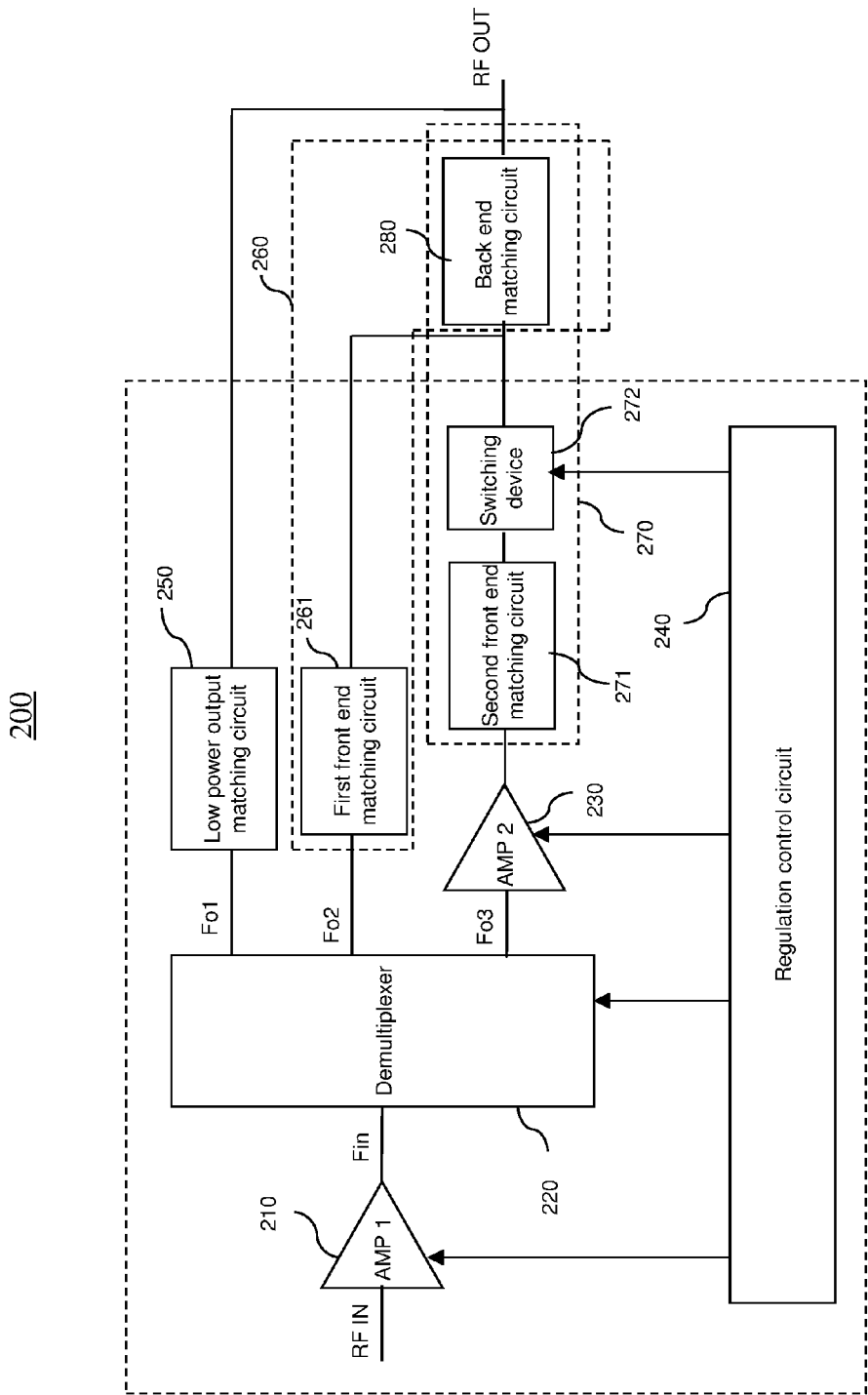
FIG. 2 is a block diagram showing a multi-mode power amplifier according to one embodiment of the present disclosure.

Embodiments of the present disclosure are discussed herein with reference to FIG. 2. However, those skilled in the art will readily appreciate that the detailed description given herein with respect to these figures is for explanatory purposes only as the present disclosure extends beyond these limited embodiments.

FIG. 2 shows a block diagram of a multi-mode power amplifier 200 according to one embodiment of the present disclosure. The multi-mode power amplifier 200 has a low power mode, a medium power mode and a high power mode. For example, an output power Po of the multi-mode power amplifier in the low power mode is lower than or equal to 7 dBm; an output power Po of the multi-mode power amplifier in the medium power mode is higher than 7 dBm and lower than or equal to 17 dBm; and an output power Po of the multi-mode power amplifier in the high power mode is higher than 17 dBm and lower than or equal to 28 dBm.

As illustrated in FIG. 2, the multi-mode power amplifier 200 comprises a power-tunable first power amplifier unit 210 (abbreviated as AMP 1), a demultiplexer 220, a second power amplifier unit 230 (abbreviated as AMP 2), a regulation control circuit 240, a low power output matching circuit 250, a medium power output matching circuit 260, and a high power output matching circuit 270. The first power amplifier unit 210 has a first power mode and a second power mode. Power of the first power amplifier unit 210 in the first power mode is lower than that in the second power mode. In an example, the output power of the first power amplifier unit 210 in the first power mode is lower than or equal to 7 dBm; and the output power of the first power amplifier unit 210 in the second power mode is higher than 7 dBm and lower than or equal to 17 dBm.

When the multi-mode power amplifier 200 is in the low power mode, the regulation control circuit 240 controls the first power amplifier unit 210 to work in the first power mode, and controls the demultiplexer 220 to connect an output terminal of the first power amplifier unit 210 to an input terminal of the low power output matching circuit 250. In this case, an input terminal of the first power amplifier unit 210 receives a radio frequency input signal RFIN, and an output terminal of the low power output matching circuit 250 outputs an amplified radio frequency output signal RFOUT.

When the multi-mode power amplifier 200 is in the medium power mode, the regulation control circuit 240 controls the first power amplifier unit 210 to work in the second power mode, and controls the demultiplexer 220 to connect the output terminal of the first power amplifier unit 210 to an input terminal of the medium power output matching circuit 260. In this case, the input terminal of the first power amplifier unit 210 receives the radio frequency input signal RFIN, and an output terminal of the medium power output matching circuit 260 outputs the amplified radio frequency output signal RFOUT.

When the multi-mode power amplifier 200 is in the high power mode, the regulation control circuit 240 controls the first power amplifier unit 210 to work in the second power mode, and controls the demultiplexer 220 to connect the output terminal of the first power amplifier unit 210 to an input terminal of the second power amplifier unit 230, and an output terminal of the second power amplifier unit 230 is coupled to an input terminal of the high power output matching circuit 270. In this case, the input terminal of the first power amplifier unit 210 receives the radio frequency input signal RFIN, and an output terminal of the high power output matching circuit 270 outputs the amplified radio frequency output signal RFOUT.

In this way, since the demultiplexer 220 and the power-tunable first power amplifier unit 210 are introduced in multi-mode power amplifier 200, the low power mode, the medium power mode and the high power mode may be implemented by using two power amplifier units. Therefore, the multi-mode power may occupy a smaller chip area and have the lower fabrication cost.

In one embodiment, the demultiplexer 220 comprises an input terminal Fin, a first output terminal Fo1, a second output terminal Fo2, and a third output terminal Fo3. The input terminal of the demultiplexer 220 is coupled to the output terminal of the first power amplifier unit 210, the first output terminal Fo1 of the demultiplexer 220 is coupled to the input terminal of the low power output matching circuit 250, the second output terminal Fo2 of the demultiplexer 220 is coupled to the input terminal of the medium power output matching circuit 260, and the third output terminal Fo3 of the demultiplexer 220 is coupled to the input terminal of the second power amplifier unit 230. The demultiplexer 220 selectively couples the input terminal Fin thereof to one of the first output terminal Fo1, the second output terminal Fo2 and the third output terminal Fo3 thereof. When the multi-mode power amplifier 200 is in the low power mode, the regulation control circuit 240 outputs the control signal to the demultiplexer 220 to control the input terminal of the demultiplexer 220 to be coupled to the first output terminal Fo1 of the demultiplexer 220. When the multi-mode power amplifier 200 is in the medium power mode, the regulation control circuit 240 outputs the control signal to the demultiplexer 220 to control the input terminal Fin of the demultiplexer 220 to be coupled to the second output terminal Fo2 of the demultiplexer 220. When the multi-mode power amplifier 200 is in the high power mode, the regulation control circuit 240 outputs the control signal to the demultiplexer 220 to control the input terminal Fin of the demultiplexer 220 to be coupled to the third output terminal Fo3 of the demultiplexer 220.

In one embodiment, the regulation control circuit 240 selectively provides a first bias voltage Vbias1 and a second bias voltage Vbias2 for the first power amplifier unit 210. When the first bias voltage Vbias1 is provided for the first power amplifier unit 210, the first power amplifier unit 210 works in the first power mode. When the second bias voltage Vbias2 is provided for the first power amplifier unit 210, the first power amplifier unit 210 works in the second power mode. Similarly, the regulation control circuit 240 may further provide a bias voltage for the second power amplifier unit 230 to enable the second power amplifier unit 230. Nevertheless, the regulation control circuit 240 may optionally be configured such that it doesn't provide the bias voltage for the first power amplifier unit 210 or the second power amplifier unit 230, so as to disable the first power amplifier unit 210 or the second power amplifier unit 230. For example, when the multi-mode power amplifier 200 is in the low power mode or the medium power mode, the regulation control circuit 240 may disable the second power amplifier unit 230. As a result, the power consumption is reduced, the power gain is greatly decreased, and the requirement on the dynamic range of the transceiver is relaxed.

In a preferred embodiment, the medium power output matching circuit 260 comprises a first front end matching circuit 261, wherein an input terminal of the first front end matching circuit 261 is coupled to the second output terminal Fo2 of the demultiplexer 220. The high power output matching circuit 270 comprises a second front end matching circuit 271, wherein an input terminal of the second front end matching circuit 271 is coupled to the output terminal of the second power amplifier unit 230. The medium power output matching circuit 260 and the high power output matching circuit 270 further comprise a common back end matching circuit 280, wherein an input terminal of the back end matching circuit 280 is coupled to an output terminal of the first front end matching circuit 261 and an output terminal of the second front end matching circuit 271, and an output terminal of the back end matching circuit 280 serves as an output terminal of the medium power output matching circuit 260 and the high power output matching circuit 270 and outputs the amplified radio frequency signal RFOUT The first front end matching circuit 261 and the back end matching circuit 280 form the medium power output matching circuit 260 to perform output impedance matching in the medium power mode. The second front end matching circuit 271 and the back end matching circuit 280 form the high power output matching circuit 270 to perform output impedance matching in the high power mode. Since the back end matching circuit 280 has converted a 50 ohms system impedance into an intermediate value lower than 50 ohms, impedance required in the medium power mode may be obtained as long as the front end matching circuit 261 is configured with a lower impedance conversion ratio. Similarly, impedance required in the high power mode may be obtained as long as the front matching circuit 271 is configured with a lower impedance conversion ratio. It should be noted that the smaller the impedance conversion ratio of the matching circuit is, the smaller the insertion loss of the matching circuit is. Meanwhile, this structure facilitates debugging of the output impedance matching circuit, and speed up the research and development.

Depending on implementation, the low power output matching circuit, the first front end matching circuit, the second front end matching circuit, and the back end matching circuit may be one of T-type matching network, PI-type matching network, LC-type matching network, and CL-type matching network, or other types of matching networks according to actual conditions.

In a preferred embodiment, the high power output matching circuit 270 of the multi-mode power amplifier 200 further comprises a switching device 272 disposed between the second front end matching circuit 271 and the back end matching circuit 280. When the multi-mode power amplifier 200 is in the high power mode, the regulation control circuit 240 further controls the switching device 272 to switch on to couple the second front end matching circuit 271 and the back end matching circuit 280, such that the second front end matching circuit 271 and the back end matching circuit 280 form the high power output matching circuit 270. When the multi-mode power amplifier 200 is in the low power mode or the medium power mode, the regulation control circuit 240 may further control the switching device 272 to switch off to isolate the second front end matching circuit 271 from the back end matching circuit 280. In this way, an adverse impact caused to the low power output matching and the medium power output matching may be prevented, and the debugging of the output matching impedance becomes simpler.

In one embodiment, no switching device such as the switching device 272 may be disposed between the first front end matching circuit 261 and the back end matching circuit 280, thereby reducing the fabrication cost. Disposing the switching device such as the switching device 272 between the first front end matching circuit 261 and the back end matching circuit 280 increases the fabrication cost, and brings limited advantages to the debugging during the research and development. Similarly, in one embodiment, no switching device may be disposed between the low power output matching circuit 250 and the back end matching circuit 280, thereby reducing the fabrication cost.

With the conventional process and technique, the regulation control circuit 240, the first power amplifier unit, the second power amplifier unit, and the output matching circuit may be disposed in different chips respectively due to incompatibility of the process. As a result, the fabrication cost is increased, and the chips may have larger area and larger package size, which is unfavorable to the integration.

One advantage or characteristic of the present disclosure is that: a bipolar field effect transistor (BiFET) process which integrates a gallium arsenide-based heterojunction bipolar transistor (HBT) process and a pseudomorphic high electron mobility transistor (pHEMT) process on the same wafer is employed. A high power device, a logical device, and a switching device may be fabricated in one chip depending on the BiFET process In one embodiment, the regulation control circuit 240, the first power amplifier unit 210, the demultiplexer 220, the second power amplifier unit 230, the low power output matching circuit 250, the first front end matching circuit 261, the second front end matching unit 271, and the switching device 272 may be integrated in the same chip, and the back end matching circuit 280 is an off-chip circuit. This greatly reduces the fabrication cost and increase integration level.

In the present disclosure, the terms "low power", "medium power, and "high power" used herein are all relative concepts. The term "high power" denotes the power thereof is higher than that of the medium power, and the term "low power" denotes the power thereof is lower than that the medium power. The three terms may be respectively referred to as the "first power", "second power", and "third power". For example, the "low power mode" is referred to as the "first power mode", and the low power output matching circuit is referred to as the "first power output matching circuit", and so on.

In summary, the present disclosure provides a multi-mode power amplifier having a low power mode, a medium power mode and a high power mode. The multi-mode power amplifier comprises a regulation control circuit, an AMP 1, a demultiplexer, an AMP 2, a low power output matching circuit, a medium power output matching circuit, and a high power output matching circuit. In the low power mode, the regulation control circuit controls the AMP 1 to work in a first power mode, and controls the demultiplexer to couple an output terminal of the AMP 1 to the low power output matching circuit. In the medium power mode, the regulation control circuit controls the AMP 1 to work in a second power mode, and controls the demultiplexer to couple an output terminal of the AMP 1 to the medium power output matching circuit. In the high power mode, the regulation control circuit controls the AMP 1 to work in the second power mode, and controls the demultiplexer to couple an output terminal of the AMP 1 to the AMP 2, wherein an output terminal of the AMP 2 is coupled to an input terminal of the high power output matching circuit. The low power mode, the medium power mode and the high power mode may be implemented by using two power amplifier units. Therefore, the multi-mode power amplifier may have smaller footprint and lower fabrication cost The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

What is claimed is:

1. A multi-mode power amplifier configured to operate in one of a low power mode, a medium power mode and a high power mode, the multi-mode power amplifier comprising:
   a power-tunable first power amplifier unit configured to operate in either a first power mode outputting a first output power or a second power mode outputting a second output power higher than the first output power;
   a demultiplexer disposed in a signal path of the multi-mode power amplifier and having an input terminal, a first output terminal, a second output terminal and a third output terminal, the input terminal coupled to an output terminal of the first power amplifier unit, the demultiplexer configured to selectively couple the input terminal to one of the first output terminal, the second output terminal and the third output terminal;
   a low power output matching circuit having an input terminal and an output terminal, the input terminal coupled to the first output terminal of the demultiplexer;
   a medium power output matching circuit having an input terminal and an output terminal, the input terminal coupled to the second output terminal of the demultiplexer;
   a second power amplifier unit having an input terminal and an output terminal, the input terminal coupled to the third output terminal of the demultiplexer;
   a high power output matching circuit having an input terminal and an output terminal, the input terminal coupled to the output terminal of the second power amplifier unit, the output terminal coupled to the output terminal of the low power output matching circuit and the output terminal of the medium power output matching circuit; and
   a regulation control circuit configured to perform one of a plurality of operations comprising:
      placing the multi-mode power amplifier in the lower power mode by configuring the first power amplifier unit to work in the first power mode and configuring the demultiplexer to couple the output terminal of the first power amplifier unit to the input terminal of the low power output matching circuit,
      placing the multi-mode power amplifier in the medium power mode by configuring the first power amplifier unit to work in the second power mode and configuring the demultiplexer to couple the output terminal of the first power amplifier unit to the input terminal of the medium power output matching circuit, and
      placing the multi-mode power amplifier in the high power mode by configuring the first power amplifier unit to work in the second power mode and configuring the demultiplexer to couple the output terminal of the first power amplifier unit to the input terminal of the second power amplifier unit.

2. The multi-mode power amplifier according to claim 1, wherein the demultiplexer is configured to selectively couple the input terminal thereof to the one of the first output terminal, the second output terminal and the third output terminal thereof based on a control signal output by the regulation control circuit,
   wherein:
      when the multi-mode power amplifier is in the low power mode, the regulation control circuit outputs the control signal to the demultiplexer to couple the input terminal of the demultiplexer to the first output terminal of the demultiplexer;
      when the multi-mode power amplifier is in the medium power mode, the regulation control circuit outputs the control signal to the demultiplexer to couple the input terminal of the demultiplexer to the second output terminal of the demultiplexer; and
      when the multi-mode power amplifier is in the high power mode, the regulation control circuit outputs the control signal to the demultiplexer to couple the input terminal of the demultiplexer to the third output terminal of the demultiplexer.

3. The multi-mode power amplifier according to claim 1, wherein the regulation control circuit selectively provides one of a first bias voltage and a second bias voltage for the first power amplifier unit, wherein the first power amplifier unit is configured to operate in the first power mode when provided with the first bias voltage, and wherein the first power amplifier unit is configured to operate in the second power mode when provided with the second bias voltage.

4. The multi-mode power amplifier according to claim 1, wherein the regulation control circuit is optionally configured to disable the first power amplifier unit or the second power amplifier unit, and wherein the regulation control circuit is further configured to disable the second power amplifier unit when the multi-mode power amplifier is in the low power mode or the medium power mode.

5. The multi-mode power amplifier according to claim 1, wherein:
the medium power output matching circuit comprises a first front end matching circuit having an input terminal coupling to the second output terminal of the demultiplexer;
the high power output matching circuit comprises a second front end matching circuit having an input terminal coupling to the output terminal of the second power amplifier unit;
each of the medium power output matching circuit and the high power output matching circuit further comprises a back end matching circuit shared by the medium power output matching circuit and the high power output matching circuit, the back end matching circuit having an input terminal coupling to an output terminal of the first front end matching circuit and an output terminal of the second front end matching circuit, the back end matching circuit also having an output terminal serving as the output terminal of the medium power output matching circuit and the output terminal of the high power output matching circuit, and
wherein:
when the multi-mode power amplifier is in the medium power mode, the first front end matching circuit and the back end matching circuit form the medium power output matching circuit to perform output impedance matching for the multi-mode power amplifier; and
when the multi-mode power amplifier is in the high power mode, the second front end matching circuit and the back end matching circuit form the high power output matching circuit to perform output impedance matching for the multi-mode power amplifier.

6. The multi-mode power amplifier according to claim 5, further comprising a switching device disposed between the second front end matching circuit and the back end matching circuit, wherein:
when the multi-mode power amplifier is in the low power mode or the medium power mode, the regulation control circuit is further configured to control the switching device to switch off and isolate the second front end matching circuit from the back end matching circuit; and
when the multi-mode power amplifier is in the high power mode, the regulation control circuit is further configured to control the switching device to switch on and couple the second front end matching circuit to the back end matching circuit.

7. The multi-mode power amplifier according to claim 6, wherein the regulation control circuit, the first power amplifier unit, the demultiplexer, the second power amplifier unit, the low power output matching circuit, the first front end matching circuit, the second front end matching circuit and the switching device are integrated in a semiconductor chip, and wherein the back end matching circuit is an off-chip circuit located outside the semiconductor chip.

8. A mobile communication terminal, comprising a multi-mode power amplifier configured to operate in one of a low power mode, a medium power mode and a high power mode, the multi-mode power amplifier comprising:
a power-tunable first power amplifier unit configured to operate in either a first power mode outputting a first output power or a second power mode outputting a second output power higher than the first output power;
a demultiplexer disposed in a signal path of the multi-mode power amplifier and having an input terminal, a first output terminal, a second output terminal and a third output terminal, the input terminal coupled to an output terminal of the first power amplifier unit, the demultiplexer configured to selectively couple the input terminal to one of the first output terminal, the second output terminal and the third output terminal;
a low power output matching circuit having an input terminal and an output terminal, the input terminal coupled to the first output terminal of the demultiplexer;
a medium power output matching circuit having an input terminal and an output terminal, the input terminal coupled to the second output terminal of the demultiplexer;
a second power amplifier unit having an input terminal and an output terminal, the input terminal coupled to the third output terminal of the demultiplexer;
a high power output matching circuit having an input terminal and an output terminal, the input terminal coupled to the output terminal of the second power amplifier unit, the output terminal coupled to the output terminal of the low power output matching circuit and the output terminal of the medium power output matching circuit; and
a regulation control circuit configured to perform one of a plurality of operations comprising:
placing the multi-mode power amplifier in the lower power mode by configuring the first power amplifier unit to work in the first power mode and configuring the demultiplexer to couple the output terminal of the first power amplifier unit to the input terminal of the low power output matching,
placing the multi-mode power amplifier in the medium power mode by configuring the first power amplifier unit to work in the second power mode and configuring the demultiplexer to couple the output terminal of the first power amplifier unit to the input terminal of the medium power output matching circuit, and
placing the multi-mode power amplifier in the high power mode by configuring the first power amplifier unit to work in the second power mode and configuring the demultiplexer to couple the output terminal of the first power amplifier unit to the input terminal of the second power amplifier unit.

9. The mobile communication terminal according to claim 8, wherein the demultiplexer is configured to selectively couple the input terminal thereof to the one of the first output terminal, the second output terminal and the third output terminal thereof based on a control signal output by the regulation control circuit,
wherein:
when the multi-mode power amplifier is in the low power mode, the regulation control circuit outputs the control signal to the demultiplexer to couple the input terminal of the demultiplexer to the first output terminal of the demultiplexer;
when the multi-mode power amplifier is in the medium power mode, the regulation control circuit outputs the control signal to the demultiplexer to couple the input terminal of the demultiplexer to be coupled to the second output terminal of the demultiplexer; and
when the multi-mode power amplifier is in the high power mode, the regulation control circuit outputs the control signal to the demultiplexer to couple the input terminal of the demultiplexer to the third output terminal of the demultiplexer.

10. The mobile communication terminal according to claim 8, wherein the regulation control circuit selectively provides one of a first bias voltage and a second bias voltage for the first power amplifier unit, wherein the first power amplifier unit is configured to operate in the first power mode when provided with the first bias voltage, and wherein the first power amplifier unit is configured to operate in the second power mode when provided with the second bias voltage.

11. The mobile communication terminal according to claim 8, wherein the regulation control circuit is optionally configured to disable the first power amplifier unit or the second power amplifier unit, and wherein the regulation control circuit is further configured to disable the second power amplifier unit when the multi-mode power amplifier is in the low power mode or the medium power mode.

12. The mobile communication terminal according to claim 8, wherein:
the medium power output matching circuit comprises a first front end matching circuit having an input terminal coupling to the second output terminal of the demultiplexer;
the high power output matching circuit comprises a second front end matching circuit having an input terminal coupling to the output terminal of the second power amplifier unit;
each of the medium power output matching circuit and the high power output matching circuit further comprises a back end matching circuit shared by the medium power output matching circuit and the high power output matching circuit, the back end matching circuit having an input terminal coupling to an output terminal of the first front end matching circuit and an output terminal of the second front end matching circuit, the back end matching circuit also having an output terminal serving as the output terminal of the medium power output matching circuit and the output terminal of the high power output matching circuit, and
wherein:
when the multi-mode power amplifier is in the medium power mode, the first front end matching circuit and the rear end matching circuit form the medium power output matching circuit to perform output impedance matching for the multi-mode power amplifier; and
when the multi-mode power amplifier is in the high power mode, the second front end matching circuit and the back end matching circuit form the high power output matching circuit to perform output impedance matching for the multi-mode power amplifier.

13. The mobile communication terminal according to claim 12, wherein the multi-mode power amplifier further comprises a switching device disposed between the second front end matching circuit and the back end matching circuit, wherein:
when the multi-mode power amplifier is in the low power mode or the medium power mode, the regulation control circuit is further configured to control the switching device to switch off and isolate the second front end matching circuit from the back end matching circuit; and
when the multi-mode power amplifier is in the high power mode, the regulation control circuit is further configured to control the switching device to switch on and couple the second front end matching circuit to the back end matching circuit.

14. The mobile communication terminal according to claim 13, wherein the regulation control circuit, the first power amplifier unit, the demultiplexer, the second power amplifier unit, the low power output matching circuit, the first front end matching circuit, the second front end matching circuit and the switching device are integrated in a semiconductor chip, and wherein the back end matching circuit is an off-chip circuit located outside the semiconductor chip.

* * * * *